(12) United States Patent
Kang et al.

(10) Patent No.: US 10,749,098 B2
(45) Date of Patent: Aug. 18, 2020

(54) ELECTRONIC ELEMENT PACKAGE AND METHOD FOR MANUFACTURING THE SAME

(71) Applicant: Samsung Electro-Mechanics Co., Ltd., Suwon-si (KR)

(72) Inventors: Pil Joong Kang, Suwon-si (KR); Kwang Su Kim, Suwon-si (KR); Jeong Il Lee, Suwon-si (KR); Jong Hyeong Song, Suwon-si (KR); Hyun Kee Lee, Suwon-si (KR); Yun Sung Kang, Suwon-si (KR); Seung Joo Shin, Suwon-si (KR); Jeong Suong Yang, Suwon-si (KR)

(73) Assignee: Samsung Electro-Mechanics Co., Ltd., Suwon-si (KR)

(*) Notice: Subject to any disclaimer, the term of this patent is extended or adjusted under 35 U.S.C. 154(b) by 776 days.

(21) Appl. No.: 15/272,618

(22) Filed: Sep. 22, 2016

(65) Prior Publication Data

US 2017/0271573 A1   Sep. 21, 2017

(30) Foreign Application Priority Data

Mar. 17, 2016   (KR) .................. 10-2016-0032166

(51) Int. Cl.
| | | |
|---|---|---|
| *H01L 41/053* | (2006.01) | |
| *H03H 9/17* | (2006.01) | |
| *H03H 9/54* | (2006.01) | |
| *H03H 9/10* | (2006.01) | |

(52) U.S. Cl.
CPC ......... *H01L 41/053* (2013.01); *H03H 9/1014* (2013.01); *H03H 9/17* (2013.01); *H03H 9/54* (2013.01); *H01L 2224/11* (2013.01); *H01L 2924/16235* (2013.01)

(58) Field of Classification Search
CPC ........... H03H 9/17; H03H 9/54; H01L 41/053
See application file for complete search history.

(56) References Cited

U.S. PATENT DOCUMENTS

| | | |
|---|---|---|
| 2003/0168943 A1 | 9/2003 | Matsuyama et al. |
| 2005/0116352 A1 | 6/2005 | Warashina et al. |
| 2009/0134957 A1 | 5/2009 | Shin |
| 2012/0256695 A1 | 10/2012 | Kuroda |

FOREIGN PATENT DOCUMENTS

| | | |
|---|---|---|
| CN | 1337091 A | 2/2002 |
| CN | 1417943 A | 5/2003 |
| CN | 1617445 A | 5/2005 |

(Continued)

OTHER PUBLICATIONS

Chinese Office Action dated Mar. 2, 2020 in counterpart Chinese Patent Application No. 201610915153.8 (8 pages in English and 6 pages in Chinese).

*Primary Examiner* — Thomas M Dougherty
*Assistant Examiner* — Karen B Addison
(74) *Attorney, Agent, or Firm* — NSIP Law (57) ABSTRACT

The present disclosure relates to an electronic element package and a method of manufacturing the same. The electronic element package includes a substrate, an element disposed on the substrate, a cap enclosing the element, a bonding portion bonding the substrate to the cap, and blocking portions disposed on both sides of the bonding portion.

19 Claims, 8 Drawing Sheets

(56) References Cited

FOREIGN PATENT DOCUMENTS

| | | | | |
|---|---|---|---|---|
| CN | 102739185 A | 10/2012 | | |
| EP | 1 152 528 A1 | 11/2001 | | |
| KR | 10-0340435 B1 | 6/2002 | | |
| KR | 10-2007-0016855 | * | 2/2007 | ............ H03H 3/02 |
| KR | 10-2009-0055073 A | 6/2009 | | |
| KR | 10-2011-0122242 A | 11/2011 | | |
| KR | 10-2015-0021308 A | 3/2015 | | |

* cited by examiner

ELECTRONIC ELEMENT PACKAGE AND METHOD FOR MANUFACTURING THE SAME

CROSS-REFERENCE TO RELATED APPLICATION

This application claims benefit under 35 USC 119(a) of priority to Korean Patent Application No. 10-2016-0032166 filed on Mar. 17, 2016 in the Korean Intellectual Property Office, the disclosure of which is incorporated herein by reference in its entirety.

BACKGROUND

1. Field

The present disclosure relates to an electronic element package and a method for manufacturing the same.

2. Description of Related Art

Recently, with the recent rapid development of mobile communications devices, the demand for macrofilters, oscillators, and other components has increased. For example, bulk acoustic wave (BAW) resonators have been regularly used to implement macrofilters, oscillators, and other components. Using BAW resonators have advantages such as enabling mass production at low cost and allowing for macrominiaturization. Furthermore, BAW resonators enables a high quality factor to be obtained and may be used in macrofrequency bands.

In general, because performance of resonators (vibrators) of BAW resonators degrade at a bonding temperature of 500° C. or more, the BAW resonators need to be hermetically sealed at a low temperature of 500° C. or less. Thus, thermal diffusion bonding, eutectic bonding or silicon direct bonding may be used. The eutectic bonding includes transient liquid phase bonding.

Furthermore, when applied to a structure having a total thickness value (TTV) difference, the eutectic bonding or the transient liquid phase bonding may cause a bonding surface to be uneven because upper and lower pressure allows a material having a low melting point or an intermetallic compound to be squeezed to run down in a liquid-like state. The unevenness of the bonding surface produces a crack on a region thereof, which causes a reduction in yield of a bonding process in which a hermetic seal is required.

To solve this problem, a method of forming a sufficient amount of melting material as a layer and pressing the layer that fully compensates for a thickness variation is frequently used, but may cause a bonding material to be increased in thickness, and a cost of raw materials rises.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, an electronic element package and method of manufacturing the same are described having a novel bonding structure in which a cap and a substrate may be sufficiently bonded with a small amount of bonding material regardless of a thickness distribution thereof.

In an embodiment, a blocking portion that may significantly reduce the flow of a bonding material may be formed around a bonding portion that may bond a substrate to a cap.

In accordance with an embodiment, there is provided an electronic element package, including: a substrate; an element disposed on the substrate; a cap enclosing the element; a bonding portion bonding the substrate to the cap; and a blocking portion disposed around the bonding portion.

The bonding portion may include: a first bonding layer formed on one of the substrate and the cap; and a second bonding layer covering the first bonding layer and contacting the blocking portion.

The blocking portion may include a blocking layer contacting the substrate and the cap.

The second bonding layer may fill a space between the first bonding layer and the blocking layer.

The blocking portion may include a groove formed in another of the substrate and the cap.

The second bonding layer may fill a space between the first bonding layer and the groove.

A width of the groove may be greater than a width of the first bonding layer.

The blocking portion may include: a blocking layer contacting the substrate and the cap; and a groove formed in another of the substrate and the cap.

The second bonding layer may fill a space between the first bonding layer and the blocking layer, and a space between the first bonding layer and the groove.

A width of the groove may be greater than a width of the first bonding layer.

The electronic element package may be a bulk acoustic wave (BAW) resonator.

In accordance with another embodiment, there is provided a method of manufacturing an electronic element package, including: forming an element on a surface of a substrate; and bonding a cap enclosing the element to the substrate, wherein the bonding is produced by a bonding portion bonding the substrate to the cap, and the bonding enables a blocking portion, formed on the substrate or the cap, to block a flow of a material forming the bonding portion.

The bonding portion may be formed by bonding a first bonding layer formed on one of the substrate and the cap to a second bonding layer formed on another of the substrate and the cap, and the bonding may enable the blocking portion to block the flow of the second bonding layer.

The bonding of the first bonding layer and the second bonding layer may be a eutectic bonding or a transient liquid phase bonding.

In accordance with a further embodiment, there is provided an electronic element package, including: a cap configured to cover a substrate; a blocking portion configured to contact a portion of an upper surface of the substrate and a portion of a lower surface of the cap; and a bonding portion configured to bond the portion of the upper surface of the substrate to the portion of the lower surface of the cap, wherein the blocking portion is disposed around the bonding portion, and the bonding portion may include a first bonding layer formed on the portion of the upper surface of the substrate, and a second bonding layer configured to cover the first bonding layer and filling a space between the first bonding layer and the blocking portion.

The first bonding layer may include a protrusion shape, a thickness of the first bonding layer is smaller than a thickness of the bonding portion, and the first bonding layer is spaced apart from the cap.

The second bonding layer may fill a space between the substrate, the cap, the first bonding layer, and the blocking portion.

The blocking portion may include a blocking layer configured to block the second bonding layer from spreading.

In accordance with an embodiment, there is provided an electronic element package, including: a cap configured to cover a substrate; a blocking portion including a groove formed on a portion of an upper surface of the substrate; and a bonding portion configured to bond the portion of the upper surface of the substrate to a portion of a lower surface of the cap, wherein the blocking portion is disposed around the bonding portion, and the bonding portion may include a first bonding layer formed on the portion of the lower surface of the cap, and a second bonding layer covering the first bonding layer and contacting the blocking portion.

The second bonding layer may fill a space between the first bonding layer, the blocking portion, the cap, and the groove.

A width of the groove may be greater than a width of the first bonding layer, and a thickness of the groove may be smaller than a thickness of the first bonding layer.

An end portion of the first bonding layer pressing the second bonding layer may be disposed in the groove to produce a firmer bond.

The first bonding layer may include a protrusion shape.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Electronic Device Module

Figure 1:
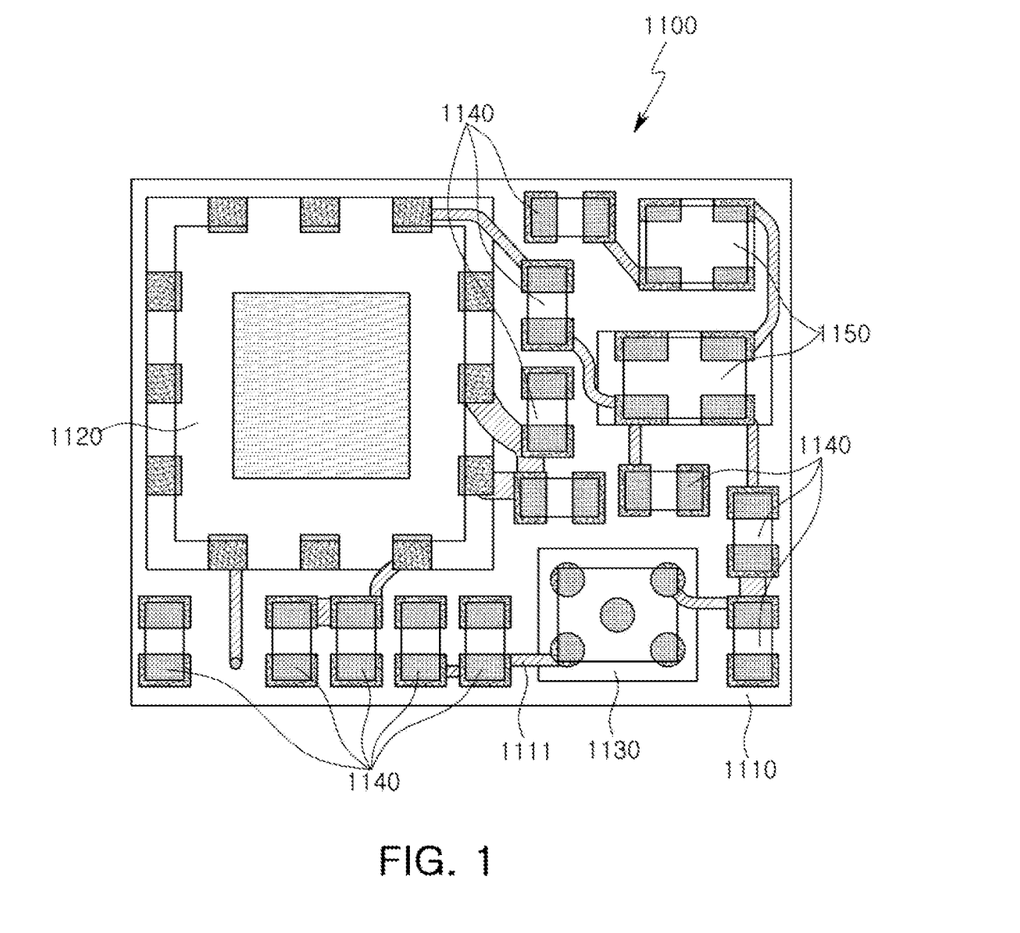
FIG. 1 is a schematic plan view of an electronic device module, in accordance with an embodiment.

FIG. 1 is a schematic plan view of an electronic device module, in accordance with an embodiment.

Referring to FIG. 1, an electronic device module 1100 includes various types of electronic components. For example, various types of passive components 1140 and 1150 and an electronic element package 1130 are mounted around an integrated circuit (IC) chip 1120 on a printed circuit board (PCB) 1110 of the electronic device module 1100. These components are electrically connected to one another through a circuit 1111, and various signals are transmitted or received through the circuit 1111.

The IC chip 1120 is a memory chip such as a volatile memory (for example, a dynamic random access memory (DRAM)), a non-volatile memory (for example, a read only memory (ROM)), or a flash memory; an application processor chip such as a central processor (for example, a central processing unit (CPU)), a graphic processor (for example, a graphic processing unit (GPU)), a digital signal processor, a cryptographic processor, a microprocessor, a microcontroller, or the like; and a logic chip such as an analog-to-digital converter (ADC), or an application-specific integrated circuit (ASIC). However, the present disclosure is not limited thereto, but the IC chip 1120 may also include other types of chip related components. These chip related components are also combined.

The passive components 1140 and 1150 may be various types of filters used to remove noise, for example, a power inductor, a high frequency (HF) inductor, a general bead, a GHz bead, a common mode filter, and the like. However, the present disclosure is not limited thereto, and the passive components 1140 and 1150 may be other passive components, such as various types of capacitors. These passive components are also combined.

The element package 1130 includes various types of micro-electro-mechanical systems (MEMS) devices, and may be, for example, a bulk acoustic wave (BAW) device, or a surface acoustic wave (SAW) device. However, the present disclosure is not limited thereto. These devices are used as filters to transmit or receive a radio frequency (RF) signal. The element package 1130, according to an embodiment, may be such an RF filter. However, the present disclosure is not limited thereto. The element package 1130 may also be other element packages to which a bonding structure described below is applied.

The electronic device module 1100 may be a typical Wi-Fi module. However, the present disclosure is not limited thereto. For example, the electronic device module 1100 may be a module used in an electronic device, such as a smartphone, a personal digital assistant, a digital video camera, a digital still camera, a network system, a computer, a monitor, a television, a video game console, or a smartwatch.

Electronic Element Package

An electronic element package, such as the element package 1130 in FIG. 1, according to an embodiment, will hereinafter be described, and for convenience, the structure of a BAW resonator is described with an example. However, the contents according to an embodiment may be applied to element packages having various different purposes as described above.

Figure 2:
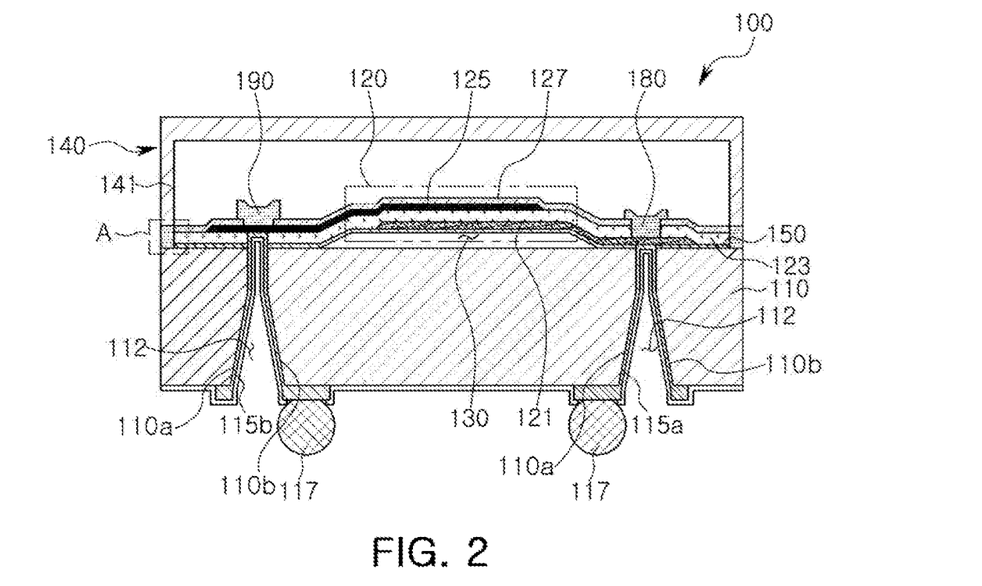
FIG. 2 is a schematic cross-sectional view of an electronic element package, in accordance with an embodiment.

FIG. 2 is a schematic cross-sectional view of an electronic element package, in accordance with an embodiment.

Referring to FIG. 2, an electronic element package 100, according to an embodiment, includes a substrate 110, an element 120, and a cap 140. An air gap 130 is formed in a space between the substrate 110 and the element 120, and the element 120 is formed on a membrane layer 150 to be spaced apart from the substrate 110 by the air gap 130.

The substrate 110 may be a silicon (Si) substrate, a high resistance silicon (HRS) substrate, a gallium arsenide (GaAs) substrate, a glass substrate, a ceramic substrate, or a silicon on insulator (SOI). However, the present embodiment is not limited thereto.

The element 120 includes a first electrode 121, a piezoelectric layer 123, and a second electrode 125. The element 120 is formed by sequentially stacking the first electrode 121, the piezoelectric layer 123, and the second electrode 125 from or on the membrane layer 150. Thus, the piezoelectric layer 123 is disposed in a space between the first electrode 121 and the second electrode 125. The element 120 is formed on the membrane layer 150 and, resultantly, the membrane layer 150, the first electrode 121, the piezoelectric layer 123, and the second electrode 125 are sequentially formed on an upper portion of the substrate 110.

The element 120 resonates with the piezoelectric layer 123 at a signal, applied to the first electrode 121 and the second electrode 125, to generate a resonant frequency or a half resonant frequency. The first electrode 121 and the second electrode 125 are formed of metals, such as gold (Au), molybdenum (Mo), lutetium (Lu), aluminum (Al), platinum (Pt), titanium (Ti), tungsten (W), palladium (Pd), chromium (Cr), and nickel (Ni). However, the present disclosure is not limited thereto.

The element 120 uses acoustic waves generated by the piezoelectric layer 123. For example, when a signal is applied to the first electrode 121 and the second electrode 125, the piezoelectric layer 123 mechanically vibrates in a thickness direction thereof to generate acoustic waves. In an embodiment, the piezoelectric layer 123 includes a zinc oxide (ZnO), an aluminum nitride (AlN), or quartz.

A resonance phenomenon of the piezoelectric layer 123 occurs when ½ of an applied signal wavelength corresponds to the thickness of the piezoelectric layer 123. When the resonance phenomenon occurs, electrical impedance rapidly changes, and an acoustic wave resonator, according to an embodiment, may be used as a filter that selects a frequency. The resonant frequency is determined depending on the thickness of the piezoelectric layer 123, the first electrode 121 and the second electrode 125 surrounding the piezoelectric layer 123, or the particular elastic wave velocity of the piezoelectric layer 123. As an example, as the thickness of the piezoelectric layer 123 is reduced, the resonant frequency increases.

The element 120 further includes a protective layer 127. The protective layer 127 is formed on an upper portion of the second electrode 125 to prevent the second electrode 125 from being exposed to an external environment. The first electrode 121 and the second electrode 125 are formed on opposite outside or exterior surfaces of the piezoelectric layer 123, and are connected to a first connecting electrode 180 and a second connecting electrode 190, respectively. The first connecting electrode 180 and the second connecting electrode 190 confirm filter characteristics of a resonator, and perform required frequency trimming. The present disclosure is not, however, limited thereto.

The element 120 is spaced apart from the substrate 110 by the air gap 130 in order to increase quality factor. For example, the air gap 130 is formed in a space between the element 120 and the substrate 110 so that the substrate 110 does not affect or influence acoustic waves generated by the piezoelectric layer 123. Further, the air gap 130 allows reflection characteristics of acoustic waves, generated by the element 120, to be improved. As an empty space, the air gap 130 has approximately infinite impedance, and thus, acoustic waves are not lost or do not propagate in the air gap 130, and remain in the element 120. Thus, the air gap 130 enables an acoustic wave loss to be reduced in a longitudinal direction thereof, resulting in an increase in a quality factor value of the element 120.

A plurality of via holes 112 passing through the substrate 110 are formed towards a lower surface of the substrate 110. A first connecting conductor 115a and a second connecting conductor 115b are formed inside the via holes 112, respectively. The first and second connecting conductors 115a and 115b are formed on internal surfaces of the via holes 112, that is, the entirety of a first inner wall 110a and a second inner wall 110b of the substrate 110. However, the present disclosure is not limited thereto. One end of each of the first and second connecting conductors 115a and 115b is connected to external electrodes 117 formed on the lower surface of the substrate 110, and the other end thereof is connected to the first electrode 121 or the second electrode 125.

For example, the first connecting conductor 115a electrically connects the first electrode 121 to the external electrode 117, and the second connecting conductor 115b electrically connects the second electrode 125 to the external electrode 117. Thus, the first connecting conductor 115a is electrically connected to the first electrode 121 through the substrate 110 and the membrane layer 150, and the second connecting conductor 115b is electrically connected to the second electrode 125 through the substrate 110, the membrane layer 150, and the piezoelectric layer 123.

Furthermore, in an example, only two via holes 112 and two connecting conductors 115a and 115b are illustrated. However, the present disclosure is not limited thereto. Based on an embodiment, a greater numbers of via holes 112 and connecting conductors 115a and 115b may be provided.

The cap 140 protects the element 120 from an exterior of the element package 100 or from an external environment. The cap 140 includes two side walls 141, each side wall 141 extending from opposite width ends of the substrate 110, toward a flat surface covering the element 120. The cap 140 has a cover shape, with a flat or a curved top surface, including an internal space in which the element 120 is accommodated. Thus, the cap 140 is bonded, soldered, welded, or attached to the substrate 110 to allow a side wall 141 of the cap 140 to surround the periphery of the element 120. Further, a lower surface of the side wall 141 is used as surface 141a bonded, soldered, welded, or attached to the substrate 110. In one embodiment, a different, separate structure may be formed in a space between the cap 140 and the substrate 110. A material of the cap 140 is not particularly limited. The cap 140 may be made, for example, of a polymer material, such as a thermosetting resin or a thermoplastic resin, or may be made of a known metal or semiconductor material. However, the present disclosure is not limited thereto.

Figure 3:
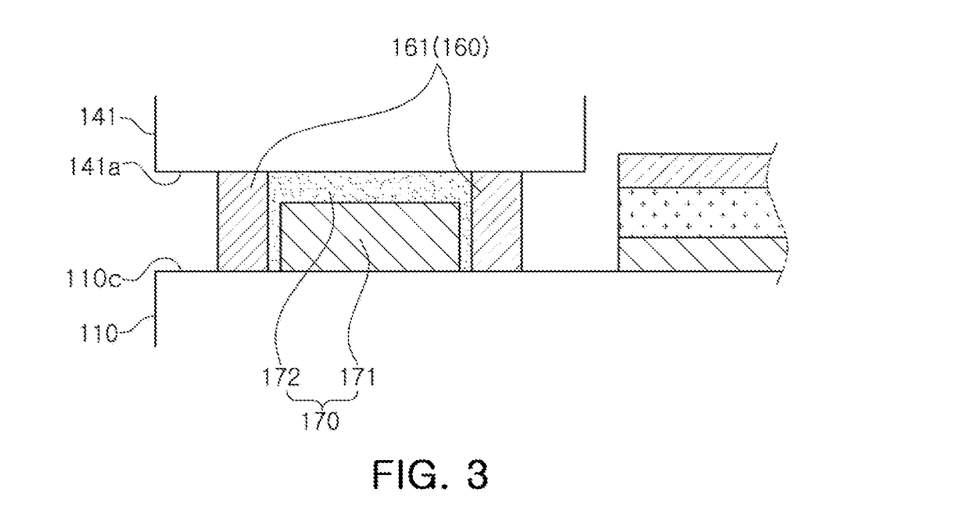
FIG. 3 is a schematic enlarged cross-sectional view of region A of FIG. 2.

FIG. 3 is a schematic enlarged cross-sectional view of region A of FIG. 2.

Referring to FIG. 3, a bonding portion A, according to an embodiment, includes a bonding portion 170 bonding the substrate 110 to the cap 140 and a blocking portion 160 disposed around the bonding portion 170. The bonding portion 170 includes a first bonding layer 171 formed on an upper surface 110c of the substrate 110 and a second bonding layer 172 covering the first bonding layer 171 and contacting the blocking portion 160. The blocking portion 160 includes a blocking layer 161 contacting the upper surface 110c of the substrate 110 and a lower surface 141a of the cap 140. In one embodiment, the term "block" used herein defines the concept of significantly, such as a reduction of 90% or greater, reducing the flow of a bonding material even though it may not be fully blocked, as well as completely blocking it.

The first bonding layer 171 is formed on the substrate 110 to have a protrusion shape. In one embodiment, the thickness of the first bonding layer 171 is smaller than that of the bonding portion 170, and the first bonding layer 171 is, thus, spaced apart from the cap 140. The first bonding layer 171 includes a parent material used in a common eutectic or transient liquid bonding process, for example, copper (Cu), gold (Au), silver (Ag), nickel (Ni), aluminum (Al), or lead (Pb). However, the present disclosure is not limited thereto.

The second bonding layer 172 covers the first bonding layer 171, and fills a space between the first bonding layer 171 and the blocking layer 161. The second bonding layer 172 contacts the substrate 110, the cap 140, the first bonding layer 171, and the blocking layer 161. The second bonding layer 172 includes a melting material used in a common eutectic or transient liquid bonding process, for example, tin (Sn), indium (In), silicon (Si), zinc (Zn), or germanium (Ge). However, the present disclosure is not limited thereto. For example, the second bonding layer 172 may be a metal or may be made of other materials.

In one embodiment, the blocking layer 161 blocks the second bonding layer 172 from being spread there around when the second bonding layer 172 is pressed by the first bonding layer 171. In general, a process may occur by area in a micro-electro-mechanical systems (MEMS) device including a BAW resonator in a bonding process due to a total thickness value (TTV) of a raw wafer, deformation of a bonding region that may occur in a process, or variations of the thickness of a layer formed of a bonding material. In this example, a difference between pressing forces occurs. As a result, a well bonded portion and a not well bonded portion are generated. However, the blocking layer 161 allows an intermetallic compound, or other similar compounds, formed by the second bonding layer 172 or the first and second bonding layers 171 and 172, to be concentrated on a bonding surface without spreading around the second bonding layer 172 or the first and second bonding layers 171 and 172. Thus, a sufficient degree of bonding may be achieved only with a small amount of bonding material.

As long as the blocking layer 161 prevents the spreading, the blocking layer 161 may be formed of any material. For example, the blocking layer 161 is formed of a polyurethane, a resin, or a metal material. In an example, a permanent epoxy resin is used because bonding strength may be increased. However, the present disclosure is not limited thereto.

Further, the drawings describe and illustrate, for convenience, the first bonding layer 171 formed on the substrate 110 and the second bonding layer 172 covering the first bonding layer 171. However, the present disclosure is not limited thereto. For example, an electronic element package includes such a bonding structure, the first bonding layer 171 is formed on the cap 140, and the second bonding layer 172 covers the first bonding layer 171.

Furthermore, in FIG. 3, the first electrode 121, the second electrode 125, the membrane layer 150, the piezoelectric layer 123, and the protective layer extend over the entire surface of the substrate 110, from the first connecting conductor 115a toward one of the two side walls 141 and from the second connecting conductor 115b toward another of the two side walls 141, spaced apart from the blocking portion 160. However, in an alternative embodiment, the first electrode 121, the second electrode 125, the membrane layer 150, the piezoelectric layer 123, and the protective layer extend over the entire surface of the substrate 110, from the first connecting conductor 115a toward the one of the two side walls 141 and from the second connecting conductor 115b toward the other of the two side walls 141, up to the blocking portion 160.

Figure 4:
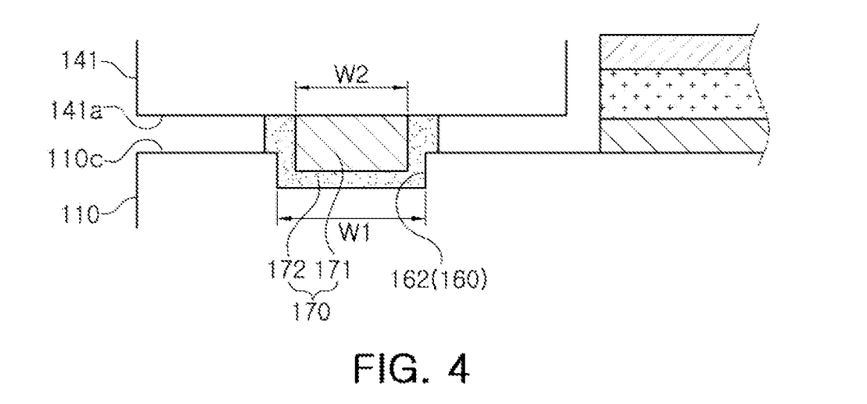
FIG. 4 is another schematic enlarged cross-sectional view of region A of FIG. 2.

FIG. 4 is another example of a schematic enlarged cross-sectional view of region A of FIG. 2.

Referring to FIG. 4, a bonding portion A, according to an embodiment, includes the bonding portion 170 bonding the substrate 110 to the cap 140 and the blocking portion 160 disposed around the bonding portion 170. The bonding portion 170 includes the first bonding layer 171 formed on the lower surface 141a of the cap 140 and a second bonding layer 172 covering the first bonding layer 171 and contacting the blocking portion 160. The blocking portion 160 includes a groove 162 formed in the upper surface 110c of the substrate 110. The second bonding layer 172 fills a space between the first bonding layer 171 and the groove 162.

Similarly to the abovementioned blocking layer 161, the groove 162 also serves to block the second bonding layer 172 from being spread there around upon the second bonding layer 172 being pressed by the first bonding layer 171. For example, the groove 162 allows an intermetallic compound, formed by the second bonding layer 172 or the first and second bonding layers 171 and 172, to be concentrated on a bonding surface without spreading around the second bonding layer 172 or the first and second bonding layers 171 and 172. Thus, a sufficient degree of bonding may be achieved with only a small amount of bonding material.

In accordance with an embodiment, a width W1 of the groove 162 is greater than a width W2 of the first bonding layer 171. The thickness of the groove 162 is smaller than that of the first bonding layer 171. An end portion of the first bonding layer 171 pressing the second bonding layer 172 is disposed in the groove 162 to enable a firmer bond regardless of a variation of the thickness of a layer.

Figure 5:
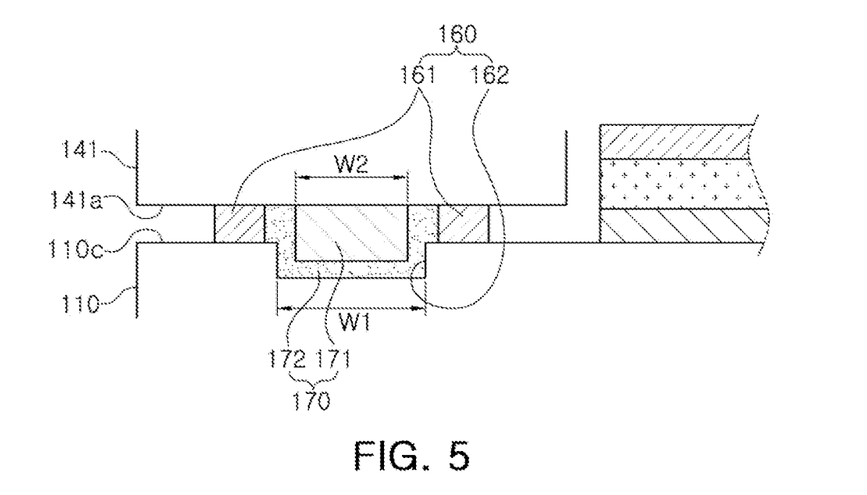
FIG. 5 is another schematic enlarged cross-sectional view of region A of FIG. 2.

In addition, the drawings describe and illustrate, for example, the first bonding layer 171 formed on the substrate 110, the groove 162 formed in the substrate 110, and the second bonding layer 172 covering the first bonding layer 171 and filling a space between the first bonding layer 171 and the groove 162. However, the present disclosure is not limited thereto. Also, the drawings describe and illustrate, for example, the first bonding layer 171 formed on the substrate 140, the groove 162 formed in the cap 140, and the second bonding layer 172 covering the first bonding layer 171 and filling a space between the first bonding layer 171 and the groove 162. However, the present disclosure is not limited thereto. FIG. 5 is another example of a schematic enlarged cross-sectional view of region A of FIG. 2.

Referring to FIG. 5, a bonding portion A, according to an embodiment, includes a bonding portion 170 bonding a substrate 110 to a cap 140 and a blocking portion 160 disposed around the bonding portion 170. The bonding portion 170 includes a first bonding layer 171 formed on the cap 140 and a second bonding layer 172 covering the first bonding layer 171 and contacting the blocking portion 160. The blocking portion 160 includes a blocking layer 161 contacting the substrate 110 and the cap 140 and a groove 162 formed in the substrate 110. The second bonding layer 172 fills a space between the first bonding layer 171 and the blocking layer 161 and a space between the first bonding layer 171 and the groove 162.

The blocking layer 161 and the groove 162 are applied together. Thus, the contents described in the abovementioned examples may be applied to the blocking layer 161 and the groove 162.

Method of Manufacturing Electronic Element Package

An example of manufacturing an electronic element package will hereinafter be described. Repeated descriptions overlapping with the abovementioned description are omitted, and a difference therebetween is primarily described.

Figure 6:
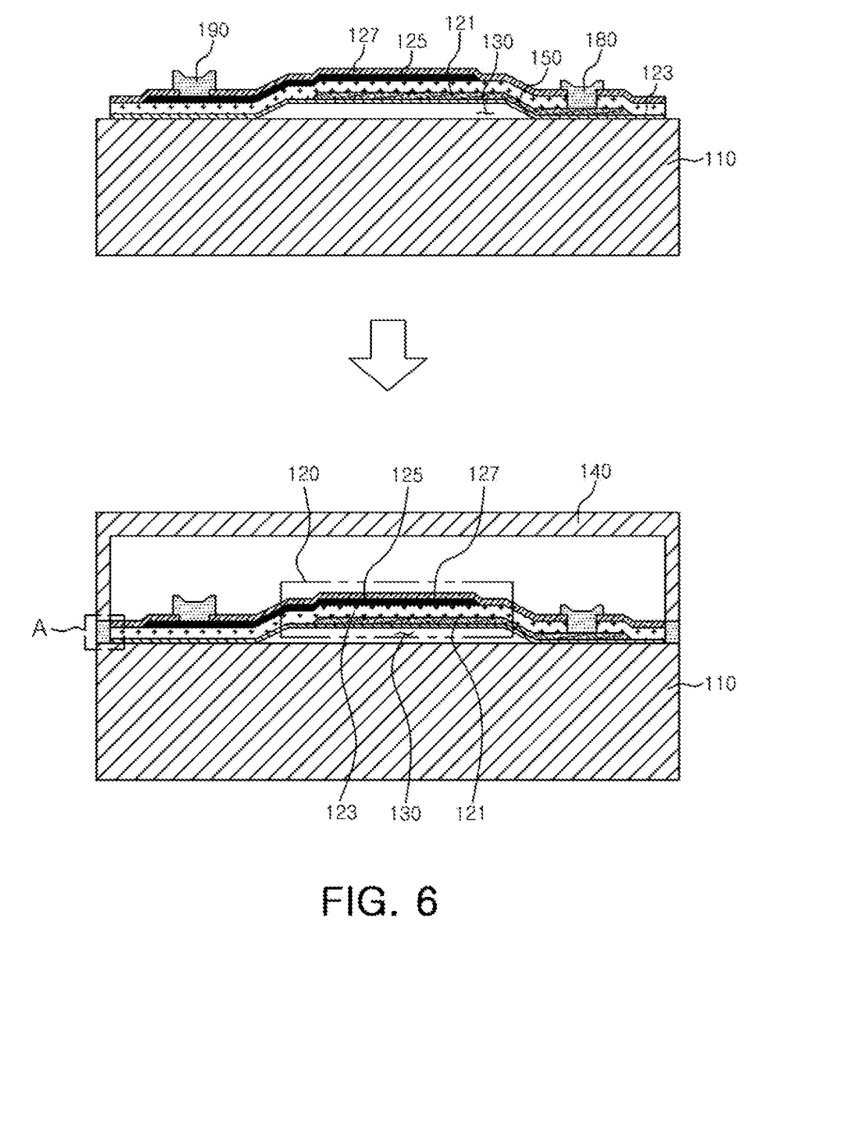
FIGS. 6 and 7 are schematic cross-sectional views of manufacturing an electronic element package, in accordance with an embodiment.

FIG. 6 is a schematic cross-sectional view of part of manufacturing an electronic element package, in accordance with an embodiment.

Referring to FIG. 6, an element 120 is formed on a substrate 110. The element 120 is formed by sequentially stacking a membrane layer 150, a first electrode 121, a piezoelectric layer 123, a second electrode 127, and a protective layer 127 on the substrate 110. A sacrificial layer (not illustrated) is formed prior to the formation of the membrane layer 150, and is removed later to form an air gap 130. The first electrode 121 and the second electrode 125 are formed as a predetermined pattern by forming a conductive layer, depositing a photoresist on an upper portion of the conductive layer, patterning the photoresist using a photolithography process, and using the patterned photoresist as a mask.

In an embodiment, the first electrode 121 is formed of a molybdenum (Mo) material, and the second electrode 125 is formed of a ruthenium (Ru) material. However, the present disclosure is not limited thereto, and a variety of metals, such as a gold (Au), ruthenium (Ru), aluminum (Al), platinum (Pt), titanium (Ti), tungsten (W), palladium (Pd), chromium (Cr), and nickel (Ni), are used as the first and second electrodes 121 and 125, depending on an embodiment. The piezoelectric layer 123 is formed of an aluminum nitride (AlN). However, the present disclosure is not limited thereto, and various piezoelectric materials, such a zinc oxide (ZnO) or quartz, are used. The protective layer 127 is formed of an insulating material. In an example, an insulating material includes a silicon oxide-based, silicon nitride-based, or aluminum nitride-based material.

Subsequently, a first connecting electrode 180 and a second connecting electrode 190 for frequency trimming are formed on upper portions of the first electrode 121 and the second electrode 125, respectively. The first and second connecting electrodes 180 and 190 are formed on the upper portions of the first and second electrodes 121 and 125, and are bonded to the first and second electrodes 121 and 125, through the protective layer 127 or the piezoelectric layer 123. The first connecting electrode 180 is formed by removing portions of the protective layer 127 and the piezoelectric layer 123 by an etching process to externally expose a portion of the first electrode 121, and by depositing gold (Au) or copper (Cu), on the first electrode 121. Similarly, the second connecting electrode 190 is formed by removing a portion of the protective layer 127 by an etching process to externally expose the second electrode 125, and by depositing gold (Au) or copper (Cu) on the second electrode 125.

Subsequently, use of the first and second connecting electrodes 180 and 190 allows filter characteristics of the element 120 to be confirmed, and a required frequency to be trimmed, and an air gap 130 is then formed. The air gap 130 is formed by removing the sacrificial layer. As a result, the element 120, a resonant portion, is completed.

Furthermore, a cap 140 is formed to protect the element 120 from an external environment. The cap 140 is formed by a wafer bonding process at a wafer level. For example, a substrate wafer, on which a plurality of unit substrates 110 are disposed, and a cap wafer, on which a plurality of caps 140 are disposed, are bonded to each other to be an integral wafer. In this case, the substrate wafer and the cap wafer bonded to each other are cut into a plurality of separate element packages by a cutting process. Further, the cap 140 is seated on the substrate 110. The cap 140 and the substrate 110 are heated and pressed to be bonded to each other. A bonding process will be described below in more detail.

Figure 7:
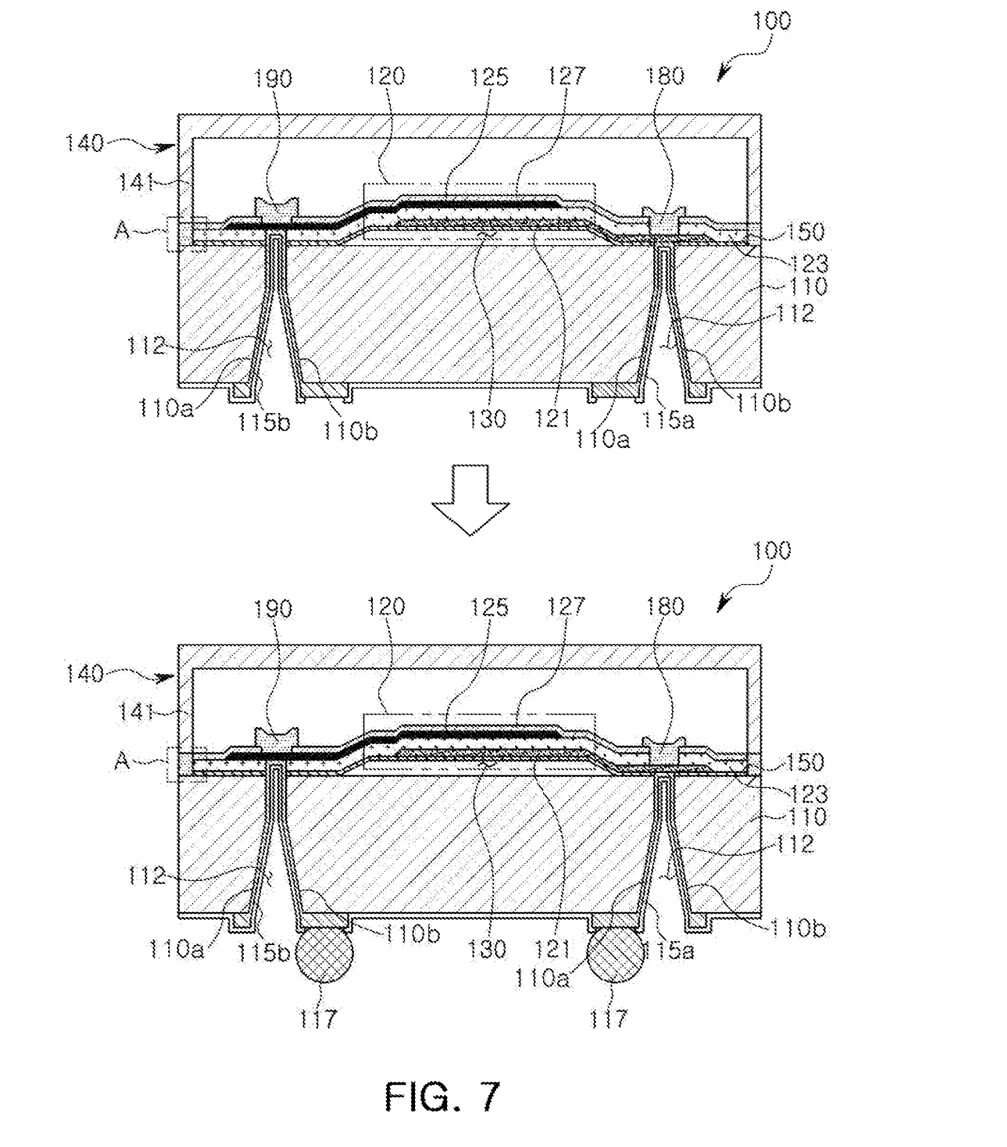

FIG. 7 is a schematic cross-sectional view of part of manufacturing an electronic element package, in accordance with an embodiment.

Referring to FIG. 7, via holes 112 are formed in the substrate 110, and a first connecting conductor 115a and a second connecting conductor 115b are formed inside the via holes 112. The first and second connecting conductors 115a and 115b are manufactured by forming conductive layers on internal surfaces 110a and 110b of the substrate 110 forming the via holes 112. For example, the first and second connecting conductors 115a and 115b are formed by depositing, coating, or providing conductive metals (for example, gold (Au) or copper (Cu)) along a first inner wall 110a and a second inner wall 110b of the substrate 110 forming the via holes 112.

Subsequently, external electrodes 117 are formed on a lower surface of the substrate 110 to complete the element package 100. The external electrodes 117 are formed on the first and second connecting conductors 115a and 115b extending to the lower surface of the substrate 110. A solder ball formed of a Tin (Sn) material is used as the external electrodes 117, but the present disclosure is not limited thereto.

Figure 8:
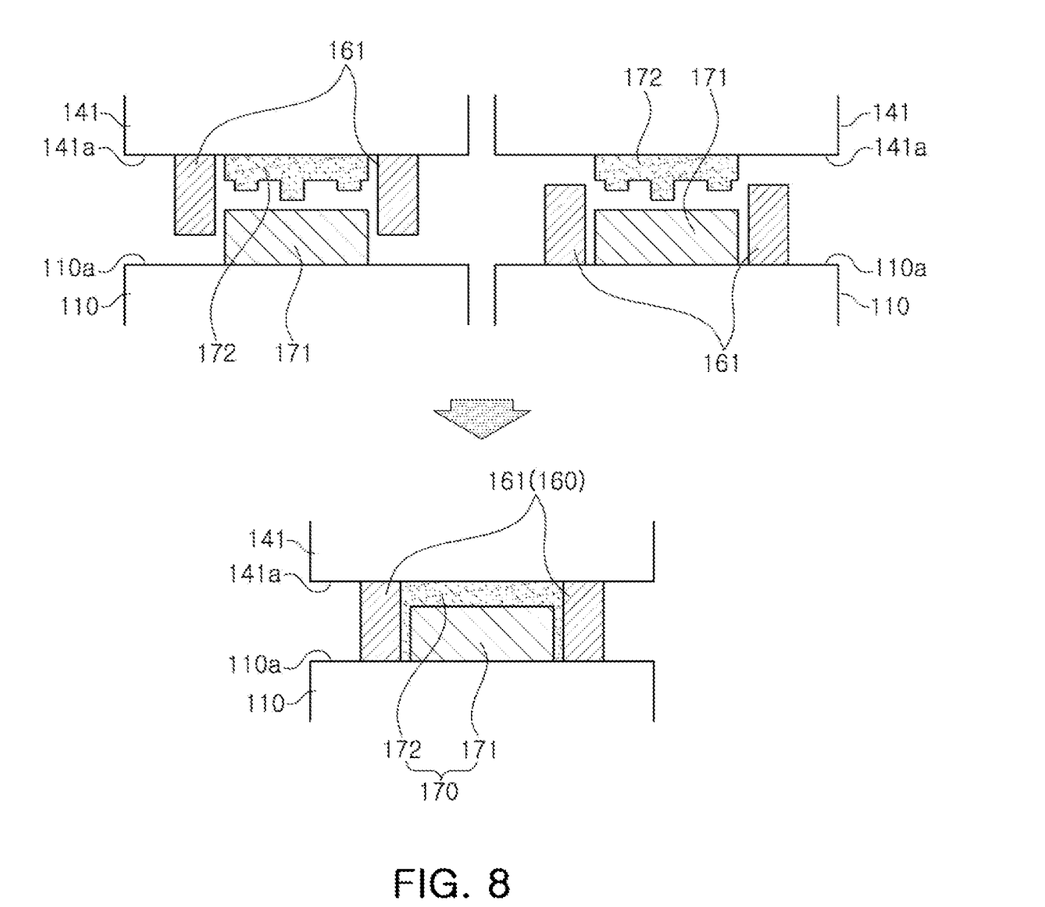
FIG. 8 is a schematic cross-sectional view of manufacturing region A of FIGS. 6 and 7.

FIG. 8 is a schematic cross-sectional view of manufacturing region A of FIGS. 6 and 7.

Referring to FIG. 8, a process of bonding the cap 140 to the substrate 110, according to an embodiment, is performed by a method of forming a bonding portion 170 that bonds the substrate 110 to the cap 140. A blocking portion 160 formed on the substrate 110 or the cap 140 blocks a material that forms the bonding portion 170 from flowing. In an embodiment, the bonding portion 170 is formed by bonding a first bonding layer 171 formed on the substrate 110 to a second bonding layer 172 formed on the cap 140, and a blocking layer 161 blocks the second bonding layer 172 from flowing. The bonding of the first and second bonding layers 171 and 172 is performed by a eutectic or transient liquid bonding process.

In the eutectic bonding process, when two heterogeneous bonding materials are in contact with each other, a melting phenomenon occurs at a lower temperature than melting points of the heterogeneous bonding materials in a specific composition such that an intermetallic compound is formed, thus, bonding the heterogeneous bonding materials on both surfaces thereof. A bonding process of copper tin (CuSn), or gold tin (AuSn), to which indium (In) or tin (Sn) having a substantially low melting point is applied, refers to a transient liquid bonding process. In the eutectic or transient liquid bonding process, when pressure is applied to upper and lower portions of a material having a low melting point or an intermetallic compound in a liquid-like state, the material or the intermetallic compound is squeezed to run down, and; thus, as described above, in a case in which there is a TTV difference or the thickness of a formed layer is non-uniform, a bonding defect may occur. Further, when the blocking layer 161 is present, the blocking layer 161 prevents the bonding defect, thus, achieving a sufficient degree of bonding even using small amounts of materials forming the first and second bonding layers 171 and 172.

Figure 9:
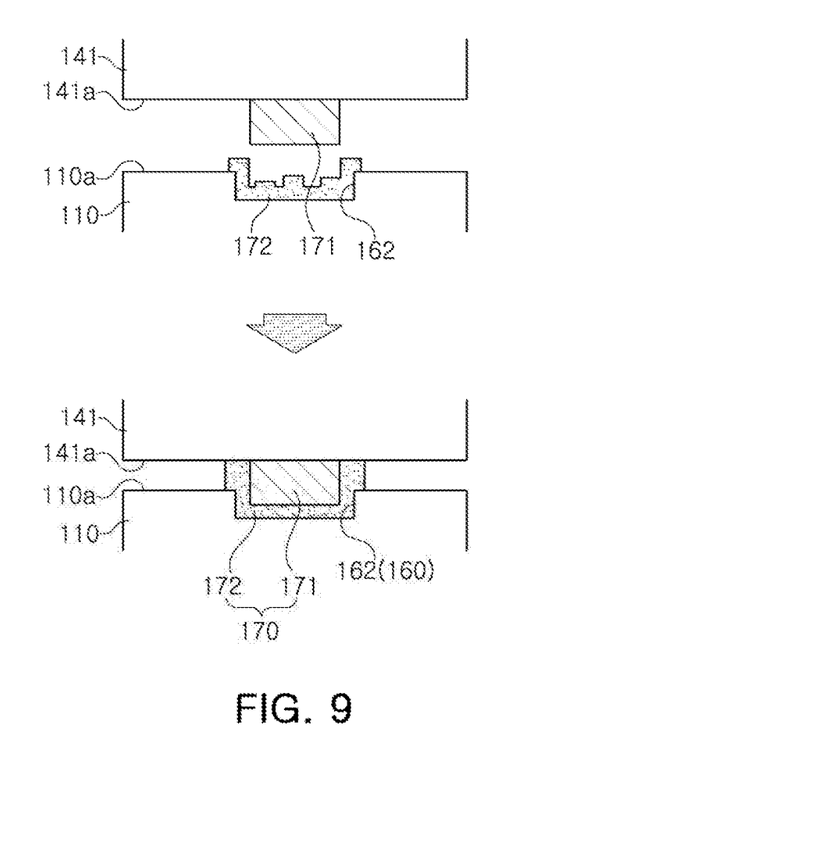
FIG. 9 is a schematic cross-sectional view of another example of manufacturing region A of FIGS. 6 and 7.

FIG. 9 is a schematic cross-sectional view of another example of manufacturing region A of FIGS. 6 and 7.

Referring to FIG. 9, a process of bonding a cap 140 to a substrate 110, according to an embodiment, is also performed by a method to form a bonding portion 170 that bonds the substrate 110 to the cap 140. A blocking portion 160 formed on the substrate 110 or the cap 140 blocks a material forming the bonding portion 170 from flowing. The bonding portion 170 is formed by bonding a first bonding layer 171 formed on the cap 140 to a second bonding layer 172 formed on the substrate 110. A groove 162 blocks the second bonding layer 172 from flowing. The bonding of the first and second bonding layers 171 and 172 is performed by a eutectic or transient liquid bonding process.

Figure 10:
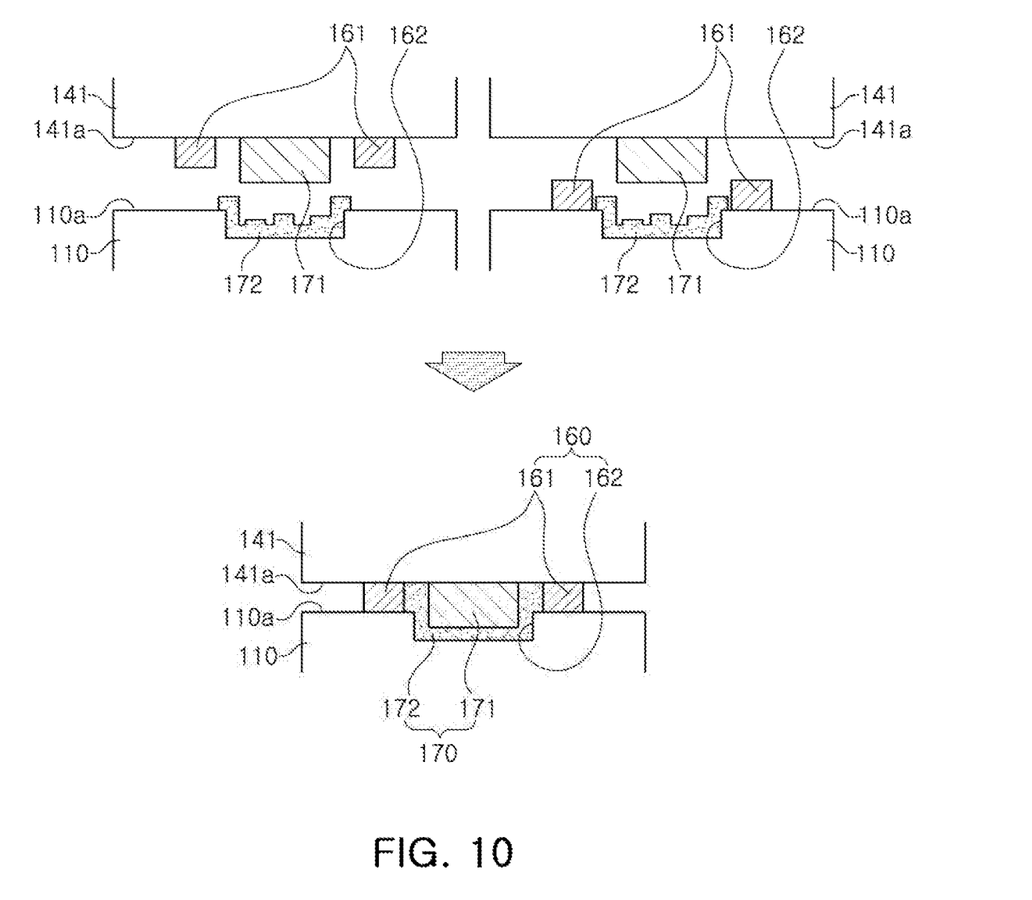
FIG. 10 is a schematic cross-sectional view of another example of manufacturing region A of FIGS. 6 and 7.

FIG. 10 is a schematic cross-sectional view of another example of manufacturing region A of FIGS. 6 and 7.

Referring to FIG. 10, a process of bonding a cap 140 to a substrate 110, according to an embodiment, is performed by a method of forming a bonding portion 170 that bonds the substrate 110 to the cap 140. A blocking portion 160 formed on the substrate 110 or the cap 140 blocks a material forming the bonding portion 170 from flowing. The bonding portion 170 is formed by bonding a first bonding layer 171 formed on the cap 140 to a second bonding layer 172 formed on the substrate 110. A blocking layer 161 and a groove 162 formed on the substrate 110 or the cap 140 block the second bonding layer 172 from flowing. The bonding of the first and second bonding layers 171 and 172 is performed by a eutectic or transient liquid bonding process.

For example, the abovementioned embodiments illustrate, as an example, bonding a cap to a substrate and then forming a connecting conductor. However, the present disclosure is not limited thereto, and various modifications, such as first forming a connecting conductor and bonding a cap to a substrate are possible.

Further, the abovementioned embodiment illustrates, as an example, a blocking layer having a quadrangular cross section. However, the present disclosure is not limited thereto, and various modifications, such as forming a triangular or trapezoidal cross section are possible.

As set forth above, according to embodiments, an electronic element package having a novel bonding structure in which a cap and a substrate may be sufficiently bonded with a small amount of bonding material regardless of a thickness distribution thereof, and a method of manufacturing the same are provided.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic element package, comprising:
   a substrate;
   an element disposed on the substrate;
   a cap enclosing the element;
   a bonding portion configured to bond the substrate to the cap; and
   a blocking portion disposed around a side surface of the bonding portion.

2. The electronic element package of claim 1, wherein the bonding portion comprises:
   a first bonding layer formed on one of the substrate and the cap; and
   a second bonding layer covering the first bonding layer and contacting the blocking portion.

3. The electronic element package of claim 2, wherein the blocking portion comprises a blocking layer contacting the substrate and the cap.

4. The electronic element package of claim 3, wherein the second bonding layer fills a space between the first bonding layer and the blocking layer.

5. The electronic element package of claim 2, wherein the blocking portion comprises a groove formed in another of the substrate and the cap.

6. The electronic element package of claim 5, wherein the second bonding layer fills a space between the first bonding layer and the groove.

7. The electronic element package of claim 5, wherein a width of the groove is greater than a width of the first bonding layer.

8. The electronic element package of claim 2, wherein the blocking portion comprises:
   a blocking layer contacting the substrate and the cap; and
   a groove formed in another of the substrate and the cap.

9. The electronic element package of claim 8, wherein the second bonding layer fills a space between the first bonding layer and the blocking layer, and a space between the first bonding layer and the groove.

10. The electronic element package of claim 8, wherein a width of the groove is greater than a width of the first bonding layer.

11. The electronic element package of claim 1, wherein the electronic element package is a bulk acoustic wave (BAW) resonator.

12. An electronic element package, comprising:
    a cap configured to cover a substrate;
    a blocking portion configured to contact a portion of an upper surface of the substrate and a portion of a lower surface of the cap; and
    a bonding portion configured to bond the portion of the upper surface of the substrate to the portion of the lower surface of the cap, wherein the blocking portion is disposed around the bonding portion, and the bonding portion comprises
    a first bonding layer formed on the portion of the upper surface of the substrate, and
    a second bonding layer configured to cover the first bonding layer and filling a space between the first bonding layer and the blocking portion.

13. The electronic element package of claim 12, wherein the first bonding layer comprises a protrusion shape, a thickness of the first bonding layer is smaller than a thickness of the bonding portion, and the first bonding layer is spaced apart from the cap.

14. The electronic element package of claim 12, wherein the second bonding layer fills a space between the substrate, the cap, the first bonding layer, and the blocking portion.

15. An electronic element package, comprising:
    a cap configured to cover a substrate;
    a blocking portion comprising a groove formed on a portion of an upper surface of the substrate; and
    a bonding portion configured to bond the portion of the upper surface of the substrate to a portion of a lower surface of the cap, wherein the blocking portion is disposed around the bonding portion, and the bonding portion comprises
    a first bonding layer formed on the portion of the lower surface of the cap, and
    a second bonding layer covering the first bonding layer and contacting the blocking portion.

16. The electronic element package of claim 15, wherein the second bonding layer fills a space between the first bonding layer, the blocking portion, the cap, and the groove.

17. The electronic element package of claim 15, wherein a width of the groove is greater than a width of the first bonding layer, and a thickness of the groove is smaller than a thickness of the first bonding layer.

18. The electronic element package of claim 15, wherein an end portion of the first bonding layer pressing the second bonding layer is disposed in the groove to produce a firmer bond.

19. An electronic element package, comprising:
    a substrate;
    an element disposed on the substrate;
    a cap enclosing the element;
    a bonding portion configured to bond the substrate to the cap; and
    a blocking portion disposed around the bonding portion, wherein the bonding portion comprises
    a first bonding layer formed on one of the substrate and the cap, and
    a second bonding layer contacting the blocking portion and the first bonding layer, and
    wherein at least a portion of the blocking portion is disposed between the element and the bonding portion.

* * * * *